(12) United States Patent
Moran

(10) Patent No.: US 7,324,570 B2
(45) Date of Patent: Jan. 29, 2008

(54) CONTINUOUS TEMPERATURE COMPENSATION FOR A LASER MODULATION CURRENT

(75) Inventor: Timothy G. Moran, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 327 days.

(21) Appl. No.: 11/072,179

(22) Filed: Mar. 4, 2005

(65) Prior Publication Data

US 2005/0195872 A1    Sep. 8, 2005

Related U.S. Application Data

(60) Provisional application No. 60/550,586, filed on Mar. 5, 2004.

(51) Int. Cl.
*H01S 3/10* (2006.01)
*H01S 3/04* (2006.01)
*H01S 3/00* (2006.01)

(52) U.S. Cl. .................. 372/26; 372/34; 372/38.07
(58) Field of Classification Search .............. 372/26, 372/29.015, 34, 38.07
See application file for complete search history.

(56) References Cited

U.S. PATENT DOCUMENTS 5,043,992 A * 8/1991 Royer et al. .............. 372/34

OTHER PUBLICATIONS

U.S. Appl. No. 11/072,180, filed Mar. 4, 2005 entitled "Regulated Current Mirror."

* cited by examiner

*Primary Examiner*—Armando Rodriguez
(74) *Attorney, Agent, or Firm*—Workman Nydegger

(57) ABSTRACT

Systems and methods for continuously compensating a modulation current of a laser. A temperature compensation circuit has circuitry with a positive temperature coefficient connected with circuitry having a negative temperature coefficient. The temperature compensation circuit generates a temperature dependent reference current that is mirrored to a gain circuit. The gain circuit provides variable gain. The gain circuit also provides inputs that can be set to select a particular gain. The output of the gain circuit, which changes as temperature affects the reference current, is used to compensate the modulation current of the laser.

25 Claims, 9 Drawing Sheets

US 7,324,570 B2

CONTINUOUS TEMPERATURE COMPENSATION FOR A LASER MODULATION CURRENT

CROSS-REFERENCE TO RELATED APPLICATIONS

This application claims the benefit of U.S. Provisional Application No. 60/550,586, filed Mar. 5, 2004 and is hereby incorporated by reference.

BACKGROUND OF THE INVENTION

1. The Field of the Invention

The present invention relates to systems and methods for modulating lasers. More particularly, the present invention relates to systems and methods for adjusting or compensating a modulation current of a laser according to temperature.

2. The Relevant Technology

Optical networks have the ability to transmit data using light or optical signals at high transmission speeds. The optical signals are usually generated by an optical transmitter, which converts an electrical signal into an optical signal. Optical transmitters often use a laser diode to generate the optical signal, although some applications use light-emitting diodes.

In order to convey data in an optical network, the data needs to be incorporated into the optical signal generated by the laser and then launched in an optical fiber. The data is encoded in the signal by modulating the laser current according to the data that is being transmitted. Perhaps the simplest way to modulate a laser is to turn the laser on for a data bit that is a 1 and turn the laser off for a data bit that is a 0. Thus, the data bits can be distinguished based on their optical power.

Experience has shown, however, that the turn off/on times of a laser can affect the transmission speed of the laser. As a result, the laser may not be turned completely off during the transmission of a data bit that is a 0. Therefore, a relatively high optical power indicates a 1 and a relatively low optical power corresponds to a 0. Data bits are still distinguished by their relative optical power and their relationship may be described by the extinction ratio.

The ability of a laser to successfully transmit an optical signal can depend on many factors, one of which is temperature. For example, the threshold current or the current at which a laser begins to lase is dependent on temperature. FIG. 1 illustrates this aspect of a laser and depicts a plot of the threshold current of a laser with respect to temperature. In FIG. 1, the curve 101 illustrates that as temperature changes, the threshold current of the laser also changes. The lowest threshold current appears at point 104, which is associated with a certain temperature $T_2$. As the temperature increases to the temperature $T_3$, the point 106 shows that the threshold current is higher than the threshold current at temperature $T_2$. Similarly, as the temperature decreases to $T_1$, the point 102 illustrates an increased threshold current with respect to the threshold current at temperature $T_2$ and the point 104.

FIG. 2 further illustrates one of the effects of temperature on lasers. FIG. 2 shows that at different temperatures, the modulation current needed to modulate the laser also changes. More specifically, FIG. 2 illustrates a graph of optical power with respect to the modulation current and temperature. The curve 214, for example, illustrates the average power 202 for the laser at a first temperature and the modulation 206 and 208 associated with the curve 214. In contrast, the curve 216 illustrates the modulation 210 and 212 required for the same or similar laser at a different temperature. The slope of the curve 216 is flatter than the slope of the curve 214, which indicates that more modulation current is required at higher (or lower) temperatures to achieve similar optical power at the laser output.

If the modulation current used in a laser is not compensated for changes in temperature, then the output power of the laser will also change. This may be reflected in the extinction ratio of the laser. For example, the extinction ratio of the optical signal may decrease as temperature of the laser increases. It is therefore desirable to adjust the modulation current of the laser to compensate for changes in temperature. If the modulation current were adjusted to compensate for temperature changes, the extinction ratio is more constant and the optical signal can be more easily received by an optical receiver.

The problem of adjusting the modulation current has typically been approached using a look up table that is based on the temperature. A look up table, however, cannot continuously adjust the modulation current in response to changes in temperature. A look up table further cannot be adjusted to account for the differences that are often present in different lasers. For example, the temperature coefficient of one laser may be quite different from the temperature coefficient of another laser. As a result, the look up table may not provide the proper information for a particular laser. In short, a look up table may not provide the flexibility that is required to continuously adjust the modulation current of a laser.

BRIEF SUMMARY OF THE INVENTION

These and other limitations are overcome by embodiments of the present invention, which relate to systems and methods for continuously adjusting a modulation current. In an optical transmitter such as a laser, the modulation current requirements of the laser change with temperature. In order to modulate the laser current such that substantially the same optical power is achieved over a range of temperatures, embodiments of the present invention continuously adjust or compensate the modulation current as temperature changes.

One embodiment of the present invention includes a temperature compensation circuit that generates a reference current that is temperature dependent. The reference current is generated by circuitry that includes a first portion with a positive temperature coefficient (TC) and a second portion that has a negative temperature coefficient. The combination of the positive TC and the negative TC result in a temperature dependent reference current.

The reference current is mirrored and/or scaled to a gain circuit that produces a temperature dependent output based on the mirrored reference current. The temperature dependent output can be used to adjust or compensate the modulation current of the laser for changes in temperature. The gain circuit is further configured with a variable gain that can be set based on one or more inputs to the gain circuit. Changing the inputs to the gain circuit selects a different gain and results in a different temperature dependent output.

The specific gain selected by the inputs is often related to the temperature coefficient of the laser. For example, if the laser has a TC of 4000 ppm/° C. (in other words, percent change in optical power per degree Celsius), then the inputs to the gain circuit are set to select the gain that compensates the modulation current according to the TC of the laser. In one embodiment, the inputs may be set to select a variable gain that can accommodate a temperature coefficient in the range, by way of example and not limitation, between 2000 ppm/° C. and 6000 ppm/° C.

Advantageously, the temperature compensation circuit produces a continuous output that responds to changes in temperature and is, in one embodiment, analog in nature. Thus, the variable gain selected by the inputs represents a curve and as the reference current changes in response to temperature, the output of the temperature compensation circuit moves on the curve. By changing the inputs to the gain circuit, the temperature compensation circuit generates an output that can be used to continuously adapt the modulation current as the temperature changes and for different temperature coefficients. The variable gain of the temperature compensation circuit can be completely variable, or may include a fixed gain plus a variable portion.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

In a laser system, the optical power generated by a laser can be described by the extinction ratio of the laser. The extinction ratio is a measure of the optical power of a 1 in relation to the optical power of a 0 and can be seen in an eye diagram. When the modulation current of a laser is insufficient, the extinction ratio decreases and the eye diagram begins to close. In other words, as the extinction ratio decreases, it becomes more difficult to interpret the optical signal.

Figure 2:
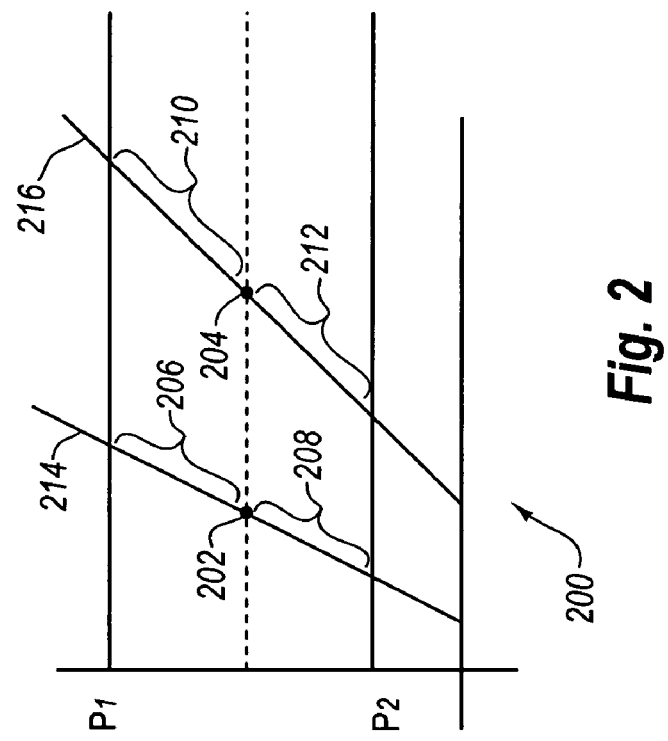
FIG. 2 illustrates that the modulation current required by a laser can change with the temperature of the laser.
Figure 1:
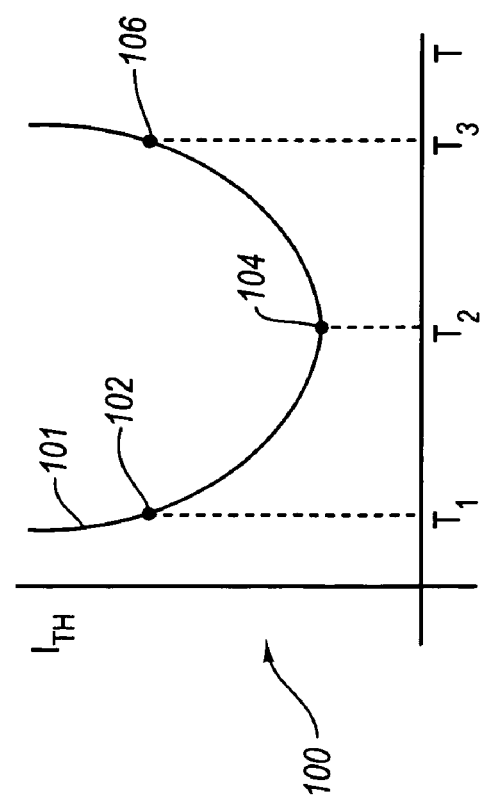
FIG. 1 illustrates that the threshold current of a laser changes with respect to temperature.

As previously described, the temperature of a laser can have an impact on the modulation current that is needed to maintain a particular extinction ratio. The modulation current requirements are also related to the temperature coefficient of the laser. Generally, the modulation current requirements increase as the temperature of the laser increases from a certain temperature, as described above with reference to FIGS. 1 and 2. One of skill in the art can appreciate, however, that the modulation current requirements may also increase with decreasing temperatures. However, the temperature of an operating laser usually tends to increase although the laser may be cold initially. Embodiments of the present invention relate to systems and methods for adapting or compensating the modulation current based on the temperature and more particularly to systems and methods for providing continuous temperature compensation for a laser modulation current.

The principles of the present invention are suitable, by way of example and not limitation, for 1G, 2G, 4G, 10G and higher bandwidth fiber channels. Furthermore, the principles of the present invention may be implemented in laser transmitter/receivers of any form factor such as XFP, SFP and SFF, without restriction. Having said this, the principles of the present invention are not limited to a laser transceiver environment at all.

Figure 3:
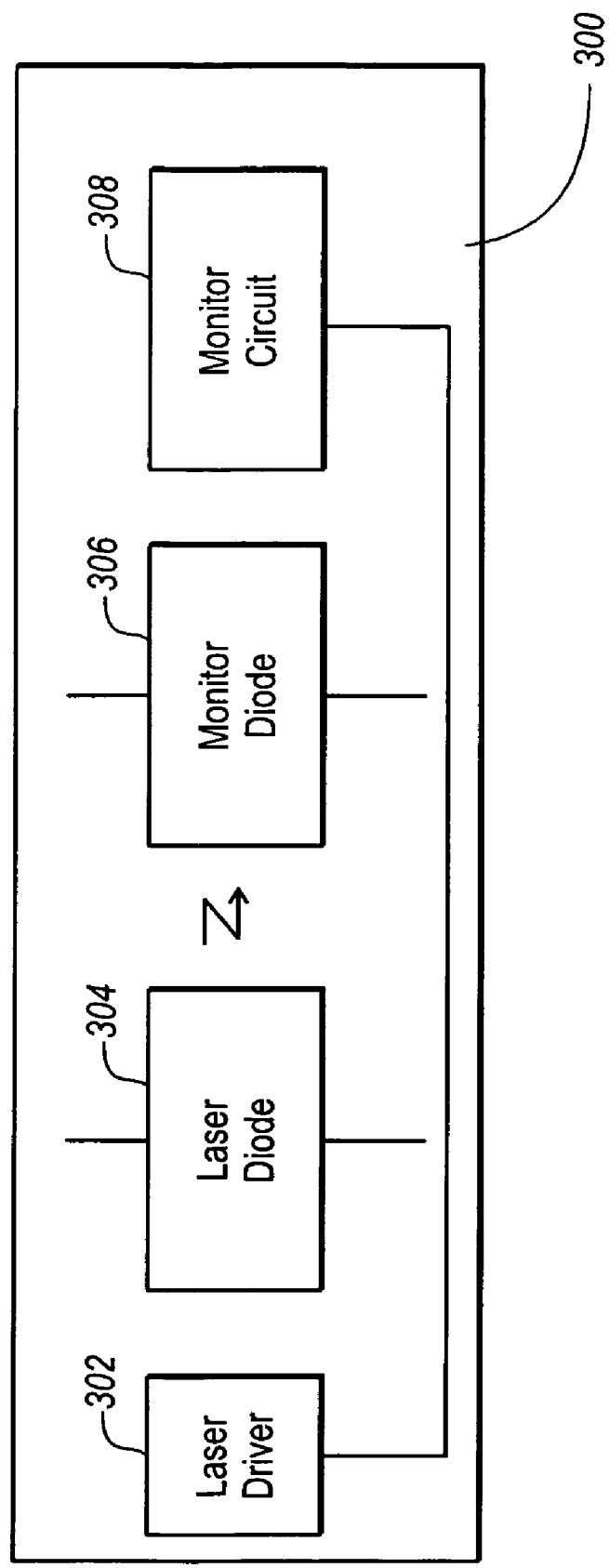
FIG. 3 illustrates an exemplary environment for implementing embodiments of the invention for continuously adjusting a modulation current of a laser based on temperature.

FIG. 3 illustrates an exemplary environment for implementing embodiments of the present invention. FIG. 3 illustrates a transceiver 300 that uses a laser diode 304 to convert an electrical data signal into an optical data signal. The laser diode 304 is configured to launch a modulated optical signal into an optical fiber, for example.

A laser driver 302 controls or drives the laser diode 304. The laser driver 302 may control the current to the laser diode 304 used to modulate the data signal. In other words, the laser driver may control the DC bias current of the laser as well as the modulation current of the laser. As the laser diode 304 transmits data, a monitor diode 306 is used to detect the laser output. The laser output is analyzed by a monitor circuit 308, which includes a temperature compensation circuit that produces feedback used by the laser driver 302 to adjust the bias current and/or the modulation current. The monitor circuit 308 may be used, in embodiments described herein, to control both a DC current as well as the AC coupled modulation current that is used to modulate the laser light.

Figure 4:
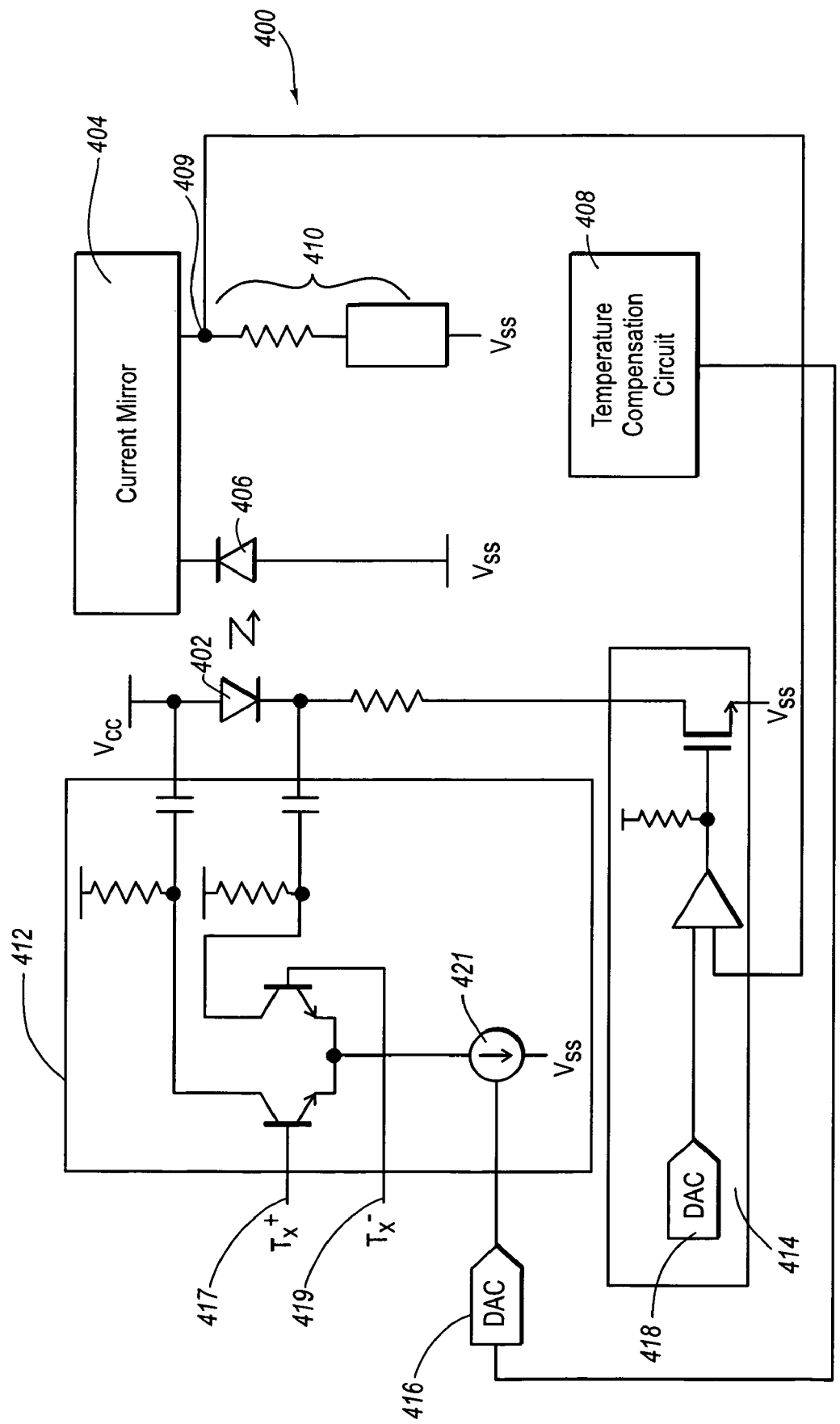
FIG. 4 illustrates one example of a laser that may be used in an optical transmitter that includes a DC bias and that includes a temperature compensation circuit for continually adjusting a modulation current that is AC coupled to the laser of the optical transmitter.

FIG. 4 illustrates one embodiment of a system 400 for implementing embodiments of the present invention. FIG. 4 illustrates a laser 402. The laser bias current is controlled with the circuit 414, which in this example, uses a DAC 418 to control a transistor such as a FET transistor to adjust the bias current in the laser. The monitor diode 406 detects the laser light and generates a monitor current that is mirrored to a detect circuit 410 by the current mirror 404. The output 409 of the detect circuit 414 is connected with the circuit 414 to provide feedback needed by the circuit 414 to adjust the bias current of the laser 402. In other words, the mirrored current produced by the current mirror 404 from the monitor current can detect changes in the bias current of the laser 402.

The system 400 also illustrates an AC coupled circuit 412. The modulation current of the laser 402 is provided through the circuit 412 in this example. In other words, the laser current is modulated through the circuit 412. In this example, a differential transmit pair 417, 419 are used to modulate the current of the laser 402. The current source 421 can be adjusted through the DAC 416, which receives an output signal from the temperature compensation circuit 408. The temperature compensation circuit 408 generates a gain or an output that is used to adjust or compensate the modulation current 421 via the DAC 416.

Figure 5:
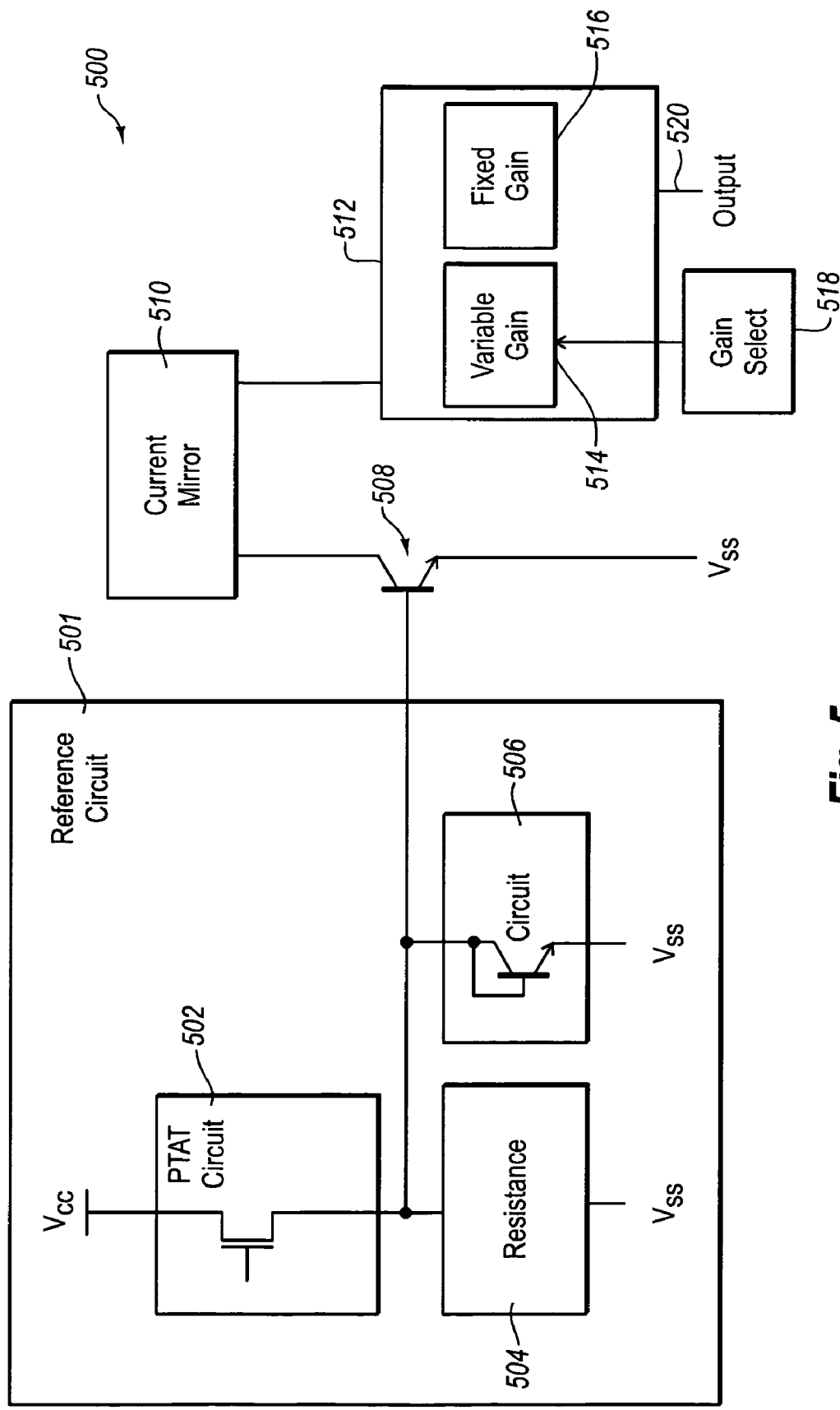
FIG. 5 is a block diagram of one embodiment of a temperature compensation circuit that produces a selectable gain used to continually adjust a modulation current of a laser.

FIG. 5 illustrates one embodiment of a temperature compensation circuit 500 that can continually adjust the modulation current of a laser in response to at least temperature. The circuit 500 produces an output 520 that is provided to the DAC (such as the DAC 416 in FIG. 4) and used to compensate the modulation current. The output 520 can be either a current or a voltage. As the output 520 changes in response to temperature, the DAC 416 uses the output 520 to adjust the modulation current accordingly.

The temperature compensation circuit 500 includes a reference circuit 501 that controls or produces a reference current in the transistor 508. The reference circuit 501 includes a PTAT (proportional to absolute temperature) circuit 502 that is coupled to a resistance 504. The PTAT circuit 502 is related to temperature in that the change in current is related to the change in temperature. The PTAT circuit 502 has a positive temperature coefficient and generates a current that is proportional to absolute temperature.

The circuit 506 is also connected with the PTAT circuit 502 at the base of the transistor 508. The circuit 506 has a negative temperature coefficient in contrast to the positive temperature coefficient of the PTAT circuit 502. In one embodiment, the circuit 506 is a diode connected transistor. In this example, the voltage across the resistance 504 is substantially the same as the voltage between the base and the emitter ($V_{BE}$) of the diode connected transistor in the circuit 506.

As previously stated, the circuit 506 has a negative temperature coefficient such that as temperature increases, $V_{BE}$ drops. At the same time, the PTAT circuit 502 includes a positive temperature coefficient. At some temperature, the combination of the current from the PTAT circuit 502 and the current from the circuit 506 turns-the transistor 508 on. As temperature continues to increase, a reference current is generated in the transistor 508 (or other current source). As temperature continues to increase, the reference current thus generated continues to increase as well.

The temperature dependent reference current generated by the reference circuit 501 in the transistor 508 is mirrored and/or scaled by the current mirror 510 and provided to a gain circuit 512. The gain circuit 512 includes a variable gain 514 and/or a fixed gain 516. The variable gain 514 can be selected using the inputs 518. The output 520 produced by the temperature compensation circuit 500 is continuously adjusted by temperature because the current produced by the reference circuit 501 is temperature dependent.

The output 520 is provided to a DAC that controls the modulation current that, in one example, is AC coupled with the laser diode. The variable gain 514 includes a circuit that uses the inputs 518 to select a particular gain or a particular gain curve. The gain curve selected by the inputs 518 is typically related to the temperature coefficient of the laser diode in this example. The temperature compensation circuit 500 is therefore programmable by a user to select a particular gain curve.

Thus, if the laser diode has a temperature coefficient of 4000 ppm/° C., then the inputs 518 are configured to select a variable gain 514 that corresponds to the temperature coefficient of the laser. The variable gain can be configured to provide a gain for a laser diode of other device that has a temperature coefficient across a range, by way of example and not limitation, 2000 ppm/° C. to 6000 ppm/° C. By changing the gain select 518, a different gain can be changed.

Thus, the gain circuit produces an output that reflects a variable gain. More specifically, the gain is variable in one sense because the inputs 518 can be set to select different gains. The gain is also variable because once the inputs 518 are set, the gain or output 520 continuously moves along a curve associated with the inputs 518 as temperature changes.

Figure 6:
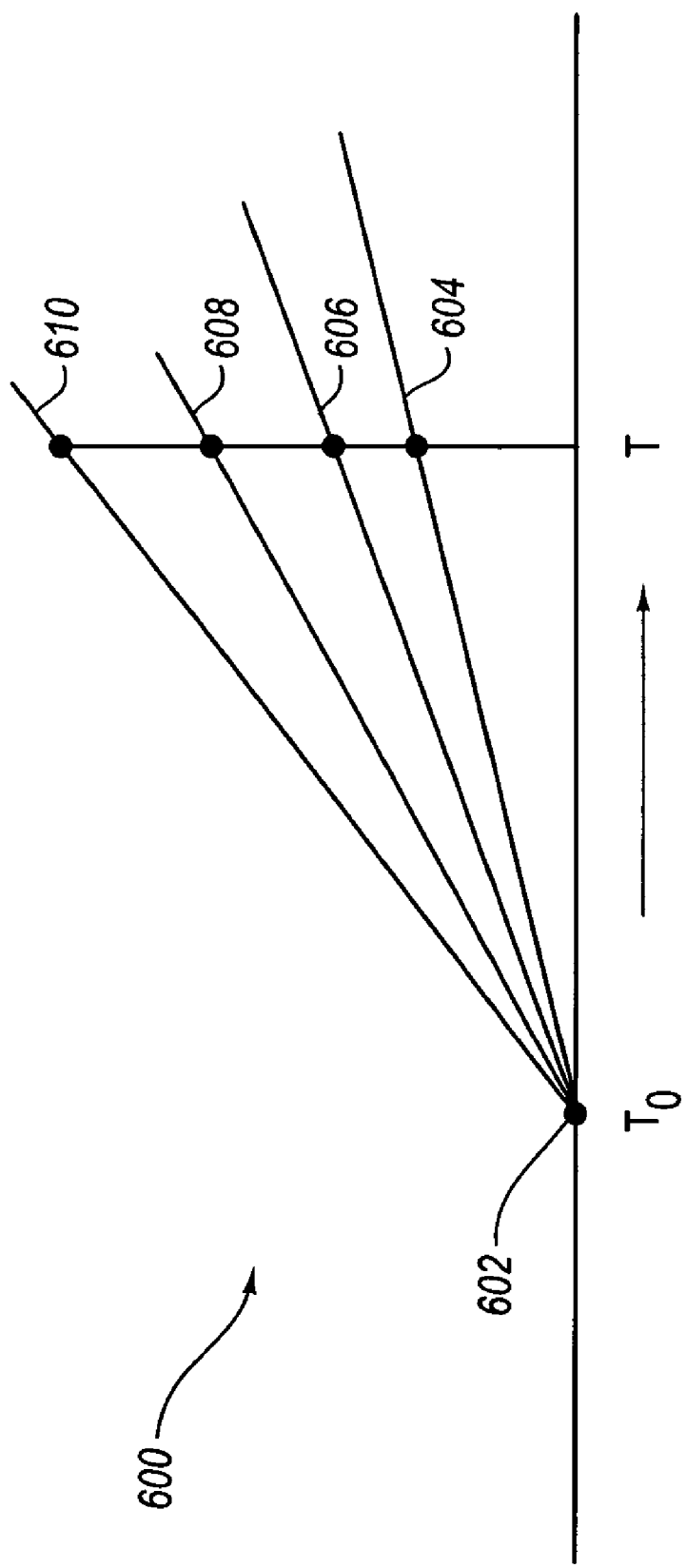
FIG. 6 illustrates examples of the variable gain that can be selected.

FIG. 6 illustrates one example of the variable gain that can be selected by the inputs 518 illustrated in FIG. 5. With reference to FIG. 5 and FIG. 6, the point 602 illustrates the point where the reference circuit 501 begins to generate a reference current in the transistor 508 that is mirrored by the current mirror 510. The inputs are used to select one of the gain curves. The curve 604, for example, may correspond to gain appropriate for a temperature coefficient of 2000 ppm/° C. The curves 606, 608, and 610 may correspond to the curves that are appropriate for temperature coefficients of 3000 ppm/° C., 4000 ppm/° C., and 6000 ppm/° C. The inputs 518 are chosen based on characteristics of the laser diode. Once a curve is selected by the inputs 518, the output 520 moves along the selected curve as the reference current changes with temperature. The inputs 518 enable the temperature compensation circuit to enable continuous compensation of a modulation current for different transmitters even when the transmitters have lasers with different temperature coefficients. The variable gain produced by the temperature compensation circuit is, in one example, programmable and the variable gain continuously adjusts with temperature, in contrast to a look up table which does not continuously adjust with temperature. As previously stated, embodiments of the present invention can also be used as temperature decreases and/or as temperature increases.

For example, if a first optical transmitter has a laser with a temperature coefficient that is different from the temperature coefficient of a laser in another optical transmitter, the appropriate gain can be set by changing the inputs 518 to the temperature compensation circuit associated with each laser. In addition, if a laser begins to demonstrate a different temperature coefficient, the inputs for that laser can also be changed accordingly. Thus, embodiments of the invention not only provide variable gain to compensate a modulation current as temperature changes, but embodiments of the invention also enable the gain to be changed when the characteristics of the laser itself change.

As temperature increases, the modulation requirements of a laser typically increase. Because the reference circuit 501 generates a current that is related to temperature, the gain circuit 512 can produce an output 520 that follows a continuous curve based on the reference current generated by the reference circuit 501. The particular curve is selected by the gain select 518 inputs. As temperatures lower than the point 602, a reference current is not generated in this example and the output 520 does not affect the modulation current of the laser diode. One of skill in the art can appreciate, however, that the circuit 500 can be adapted to compensate for decreasing temperatures as well. If the inputs are set incorrectly, the laser diode will continue to be modulated and the optical transmitter does not fail. Rather, the modulation current may not be optimum.

Figure 7A:
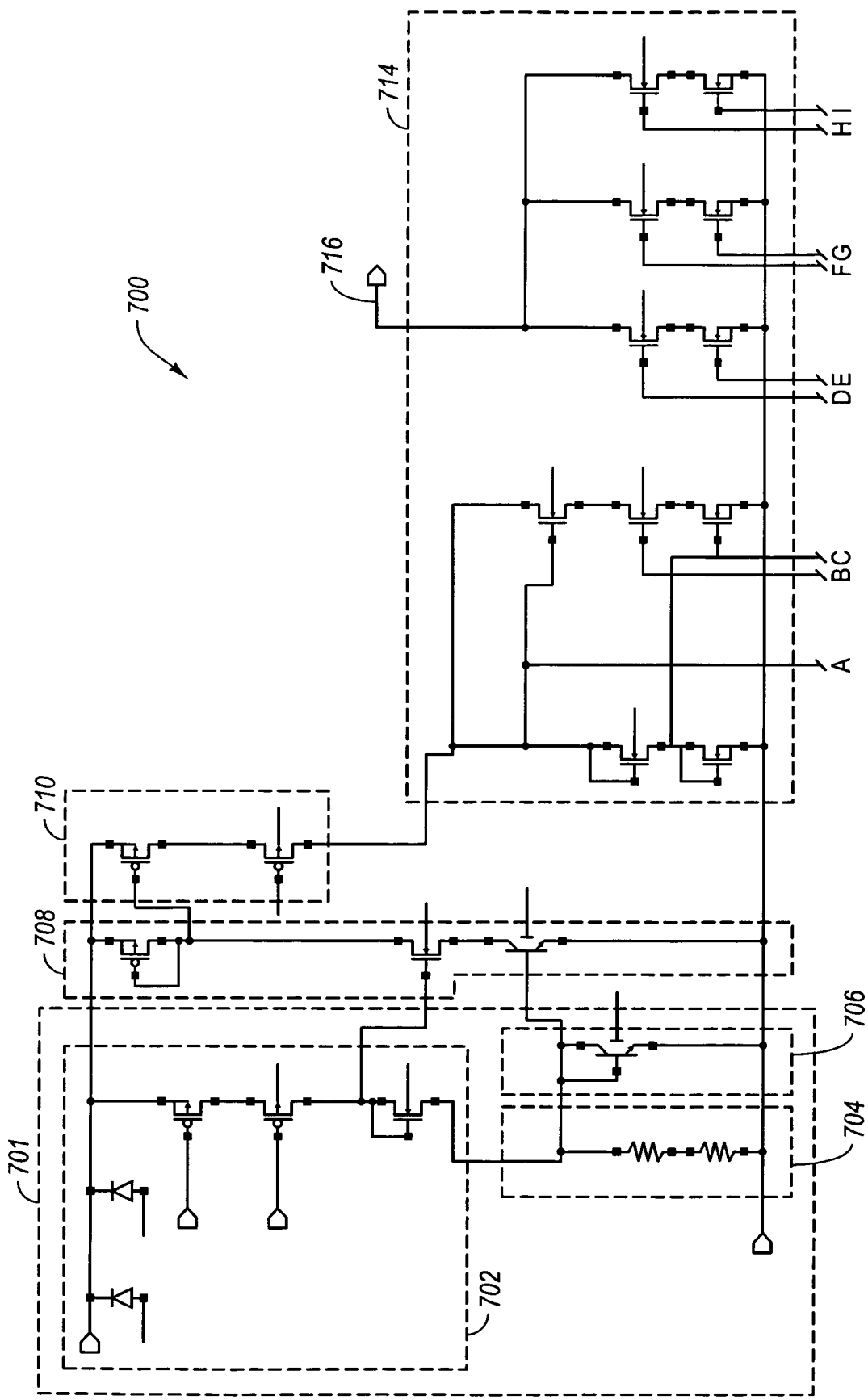
FIGS. 7A and 7B is a schematic of one embodiment of a temperature compensation circuit that produces a variable gain based on a temperature dependent reference current that is generated by circuitry having a positive temperature coefficient combined with circuitry having a negative temperature coefficient.
Figure 7B:
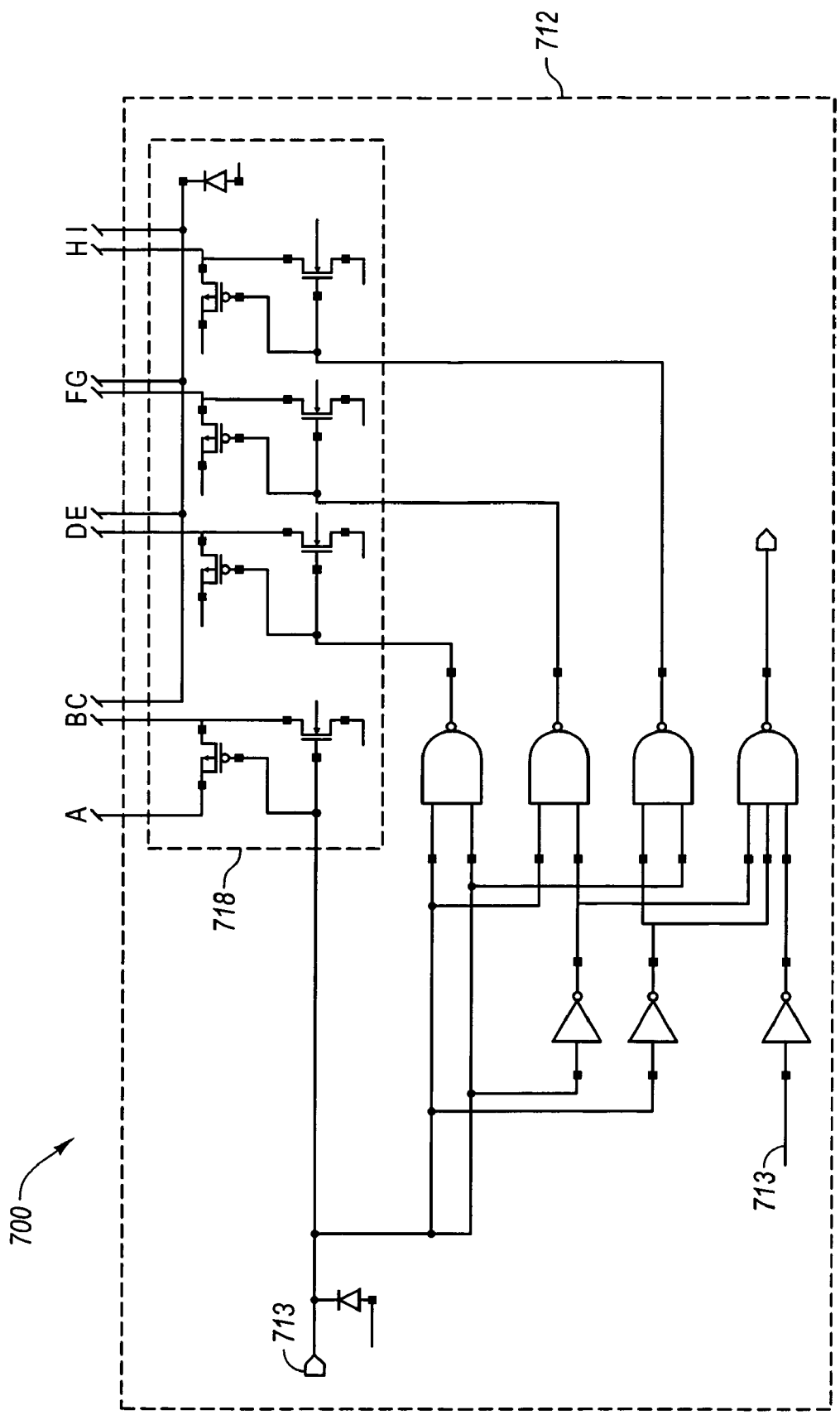

FIGS. 7A and 7B illustrate one embodiment of a temperature compensation circuit 700 used to adjust or compensate a modulation current as temperature changes. Circuit 700 may be an integrated circuit. The circuit 700 includes a reference circuit 701 that generates a reference current in a current mirror 708. The reference circuit 701 includes a PTAT (proportional to absolute temperature) circuit 702 that has a positive temperature coefficient and generates a current that is proportional to absolute temperature. The PTAT current generated by the PTAT circuit 702 combines with the current of the circuit 706, which includes a diode connected NPN transistor in this example, to turn the current mirror 708 on at a certain temperature. The voltage across the circuit 706 is reflected in the voltage across the resistance 704. In one embodiment, this voltage is substantially equal to the voltage from the base to the emitter of the diode connected transistor included in the circuit 706. Thus, the reference circuit 701 generates a reference current in the current mirror 708 that is dependent on temperature.

The reference current thus flows in the current mirror 708 and changes with temperature. The current mirror 710 mirrors the reference current. The mirrored reference current from the current mirror 710 is amplified by the gain circuit 714 to produce an output 716. As previously indicated, the gain provided by the gain circuit 714 is variable and can be set through the gain select circuit 712.

One or more inputs 713 are provided to logic gates 720 in the gain select circuit 712. The outputs of the logic gates 720 control switches 718 that have an impact on the gain of the gain circuit 714. More particularly, the inputs 713 may include, by way of example and not limitation, four bits. Using inverters, the logic gates (which are NAND gates in this example) combine the inputs 713 in various configurations to generate signals that turn certain of the switches 718 on or off. The output 716 is thus affected according to the state of the inputs to the gain select circuit 712. The gain circuit 714 includes transistors that are configured to amplify the current from the current mirror 710. The transistors or other gain producing elements are configured to provide different gains as previously described.

Depending on the state of the switches 718, the gain of the gain circuit 714 is affected. In other words, the gain curves illustrated in FIG. 6 represent the gains that occur based on the states of the switches 718. The gain of the output 716 is therefore variable. In addition, the output 716 may include a fixed portion in addition to the variable portion that is selected by the inputs 713.

Figure 8A:
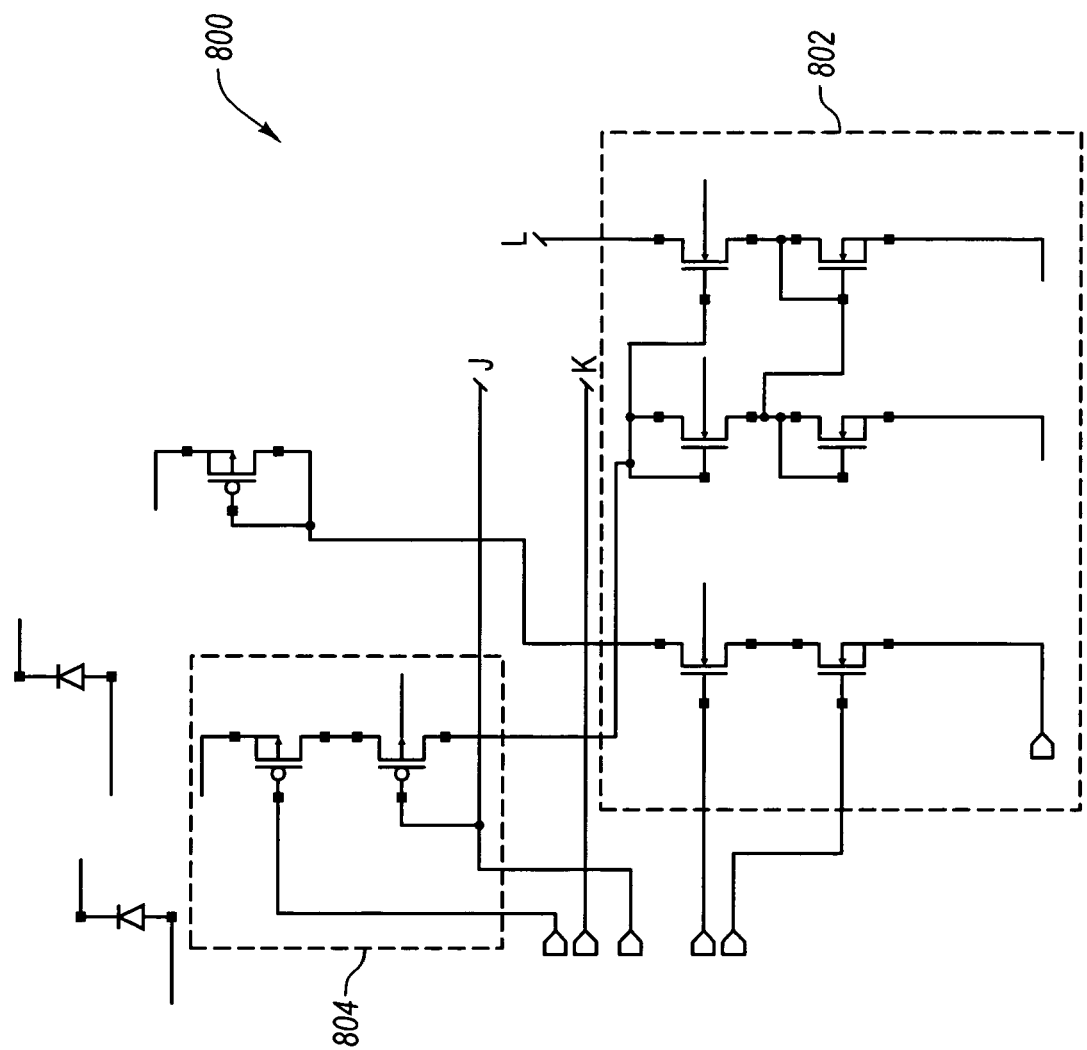
FIGS. 8A and 8B illustrates a temperature compensation circuit and illustrates fixed gain that can be combined with variable gain from the temperature compensation circuit.
Figure 8B:
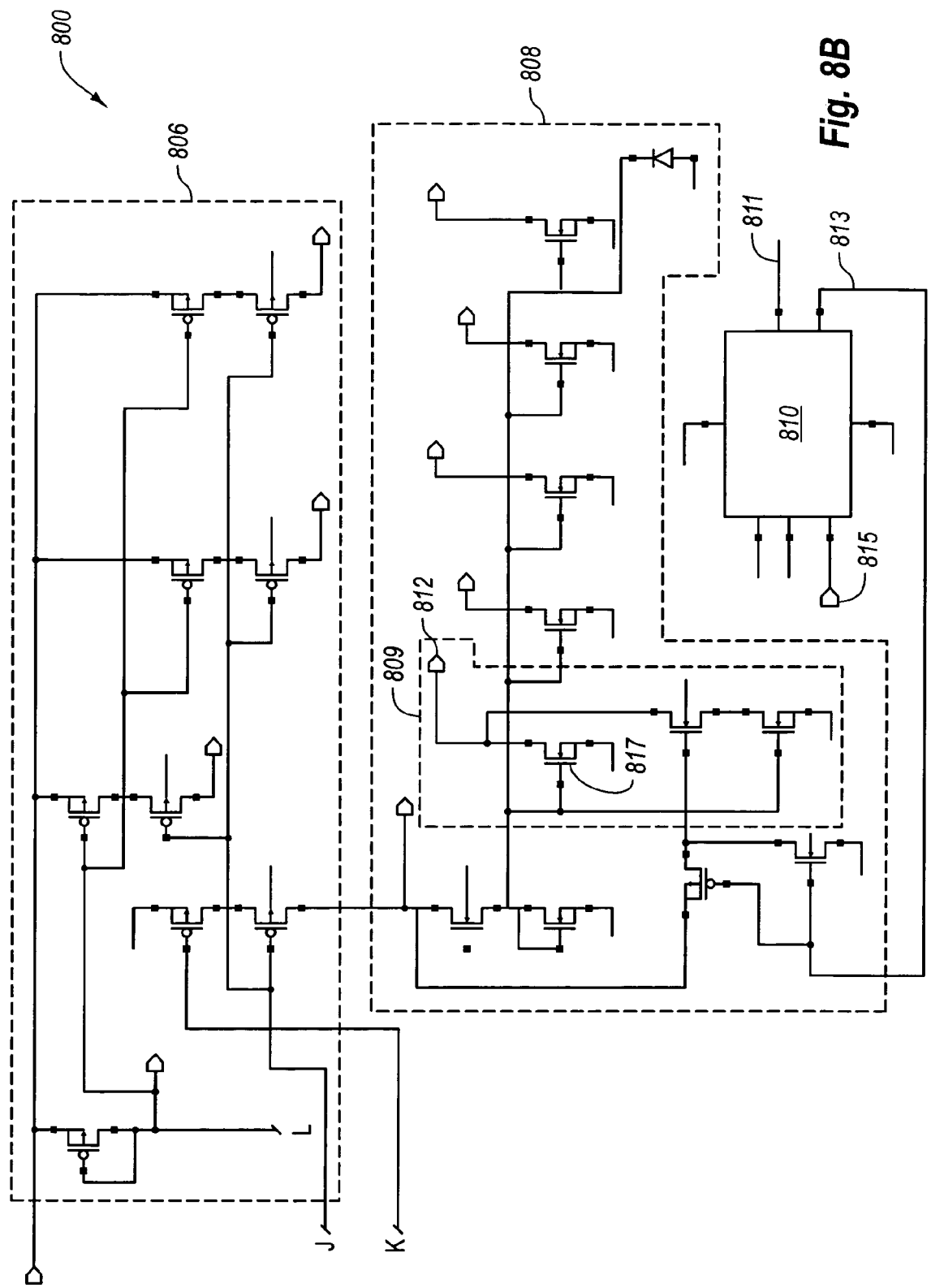

FIGS. 8A and 8B illustrate another embodiment of the present invention. In FIGS. 8A and 8B, a current generated in block 804 is mirrored and/or scaled by the block 802. The block 806 includes additional mirrored currents that may be scaled. The currents generated in the block 806 may be proportional to absolute temperature and may serve as bias currents. In this example, the transistor block 809 including the transistor 817, is used, in one embodiment, to generate a fixed gain this is combined with the variable gain generated by the temperature compensation circuit 810. In one embodiment, the outputs 811 and 812 are combined to produce the gain that will be used to compensate the modulation current of the laser. The other transistors in the block 808 can be used to produce other currents. The output 813 can be generated from the inputs 815 (similar to the inputs 713 in FIGS. 7A and 7B) and is an output used to insure, in one embodiment, that the temperature compensation circuit 810 functions appropriately.

A circuit for use in an optical transmitter to adjust a modulation current of a laser as a temperature changes may include means for producing a reference current that is dependent on temperature. The means for producing a reference current including a first portion having a positive temperature coefficient connected with a second portion having a negative temperature coefficient. A current mirror is one example of a means for mirroring a reference current to a gain circuit. The inputs used to select a particular gain are an example of means for setting a variable gain on the gain circuit to produce an output that is used to adjust a modulation current of a laser to account for changes in temperature.

A circuit for adjusting a modulating current in a laser includes, in one embodiment, a reference circuit that produces a reference current based at least on a temperature of the reference circuit or of the laser. Thus, a PTAT current that is associated with a positive TC combined with a circuit (such as a diode connected NPN transistor) that has a negative TC can be used to generate the reference current. A gain circuit electrically connected with the reference circuit has inputs that can be used to select a particular gain. The particular gain may be combined with a fixed gain and the combination or just the variable gain, is used to adjust the modulation current as the output power of the laser changes with temperature.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A circuit for adjusting a modulation current in a laser, the circuit comprising:
   a reference circuit that produces a reference current based at least on a temperature of the reference circuit or of the laser; and
   a gain circuit electrically connected with the reference circuit, the gain circuit having one or more inputs that are used in combination with the reference current to select a particular gain, wherein the particular gain is used to adjust a modulation current of the laser,
   wherein the reference circuit comprises:
   a first portion having a positive temperature coefficient; and
   a second portion connected to the first portion, the second portion having a negative temperature coefficient.

2. A circuit as defined in claim 1, the reference circuit further comprising:
   one or more transistors, the one or more transistors generating a current that is proportional to absolute temperature; and
   a diode connected transistor connected with the one or more transistors, the diode connected transistor having a negative temperature coefficient.

3. A circuit as defined in claim 2, wherein the one or more transistors are p-type transistors and the diode connected transistor is an NPN transistor.

4. A circuit as defined in claim 2, the reference circuit further comprising a resistance connected with the one or more transistors and the diode.

5. A circuit as defined in claim 1, further comprising a first current mirror that mirrors the reference current produced by the reference circuit.

6. A circuit as defined in claim 1, the gain circuit further comprising a fixed gain portion that produces a fixed gain and a variable gain portion producing a variable gain according to the one or more inputs.

7. A circuit as defined in claim 1, the gain circuit further comprising one or more logic gates that combine the one or more inputs to selectively activate one or more switches that select the particular gain.

8. A circuit as defined in claim 1, wherein the one or more inputs are set based on a temperature coefficient of the laser, wherein the particular gain output by the gain circuit adjusts a modulating current based on temperature.

9. A circuit for use in an optical transmitter to adjust a modulation current of a laser as a temperature changes, the circuit comprising:
    means for producing a reference current that is dependent on temperature, the means for producing a reference current including a first portion having a positive temperature coefficient connected with a second portion having a negative temperature coefficient;
    means for mirroring the reference current to a gain circuit; and
    means for setting a variable gain on the gain circuit to produce an output that is used to adjust a modulation current of a laser to account for changes in temperature, wherein the means for setting a variable gain uses at least the mirrored reference current to set the variable gain.

10. A circuit as defined in claim 9, wherein the means for producing a reference current that changes according to temperature further comprises a resistance connected with the first portion and with the second portion.

11. A circuit as defined in claim 9, wherein the means for producing a reference current generates a reference current in a first current mirror.

12. A circuit as defined in claim 11, wherein mirroring the reference current to a gain circuit further a comprises a second mirror that mirrors the reference current to the means for setting a variable gain.

13. A circuit as defined in claim 9, the means for producing a reference current further comprising:
    a diode connected transistor that has a negative temperature coefficient; and
    one or more transistors connected with the diode connected transistor, the one or more transistors generating a current that is proportional to absolute temperature; and
    a resistance connected with the diode connected transistor and with the one or more transistors.

14. A circuit as defined in claim 9, wherein the means for setting a variable gain on the gain circuit further comprises:
    one or more switches;
    one or more logic gates connected with the one or more switches; and
    one or more inputs that are connected with the one or more logic gates such that a state of the one or more inputs controls a state of each of the one or more switches.

15. A circuit as defined in claim 13, wherein the one or more switches are configured to determine the variable gain of the gain circuit that is applied to the mirrored reference current received by the gain circuit.

16. A circuit as defined in claim 13, wherein the one or more inputs are selected based on a temperature coefficient of the laser.

17. A circuit as defined in claim 9, wherein the variable gain is in a range between 2 millivolts/C and 6 millivolts/C.

18. A circuit as defined in claim 9, wherein the output is connected to a DAC that adjusts a modulation current of the laser based on the output.

19. A circuit for adjusting a modulation current in a laser, the circuit comprising:
    a reference circuit that includes a first portion having a positive temperature coefficient coupled with a second portion having a negative temperature coefficient, wherein the reference circuit begins produces a reference current that changes in response to changes in temperature;
    a current mirror that mirrors the reference current; and
    a gain circuit having one or more inputs to select a particular gain curve, wherein the gain circuit produces a temperature dependent output based on the particular gain curve and the mirrored reference current;
    wherein the temperature dependent output compensates a modulation current of a laser for changes in temperature.

20. A circuit as defined in claim 19, wherein the first portion of the reference circuit comprises one or more transistors, the one or more transistors generating a current that is proportional to absolute temperature.

21. A circuit as defined in claim 20, wherein the second portion of the reference circuit comprises a diode connected transistor, wherein the diode connected transistor is an NPN transistor and the one or more transistors in the first portion of the reference circuit are p-type transistors.

22. A circuit as defined in claim 19, the reference circuit further comprising a resistance connected with the first portion and the second portion of the reference circuit.

23. A circuit as defined in claim 19, wherein the reference circuit generates the reference current in a transistor, wherein the reference circuit is connected with the base of the transistor.

24. A circuit as defined in claim 19, wherein the one or more inputs to the gain circuit are set based on a temperature coefficient of the laser.

25. A circuit as defined in claim 19, wherein the mirrored reference current causes the temperature dependent output to correspond to a particular gain on a particular gain curve that is set by the one or more inputs.

* * * * *